US009373810B2

(12) United States Patent
Yamana et al.

(10) Patent No.: US 9,373,810 B2
(45) Date of Patent: Jun. 21, 2016

(54) ORGANIC EL ELEMENT AND LIGHT-EMITTING APPARATUS INCLUDING THE SAME

(71) Applicant: Panasonic Intellectual Property Management Co., Ltd., Osaka (JP)

(72) Inventors: Masahito Yamana, Hyogo (JP); Manabu Nakata, Osaka (JP); Toshihiro Higuchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/640,923

(22) Filed: Mar. 6, 2015

(65) Prior Publication Data
US 2015/0280168 A1 Oct. 1, 2015

(30) Foreign Application Priority Data

Mar. 26, 2014 (JP) .................................. 2014-063545

(51) Int. Cl.
*H01L 51/52* (2006.01)
(52) U.S. Cl.
CPC ........ *H01L 51/5221* (2013.01); *H01L 51/5206* (2013.01); *H01L 51/5268* (2013.01); *H01L 51/5271* (2013.01); *H01L 2251/558* (2013.01)
(58) Field of Classification Search
CPC ............ H01L 51/5221; H01L 51/5268; H01L 51/5271; H01L 51/5206
See application file for complete search history.

(56) References Cited

U.S. PATENT DOCUMENTS

| 2003/0214227 | A1 | 11/2003 | Tsuchiya | |
|---|---|---|---|---|
| 2010/0231825 | A1 | 9/2010 | Koma et al. | |
| 2013/0077022 | A1 | 3/2013 | Sano | |
| 2013/0182418 | A1 | 7/2013 | Sawabe et al. | |
| 2014/0346971 | A1* | 11/2014 | Shida | H05B 33/0896 315/294 |
| 2015/0028318 | A1* | 1/2015 | Schlenker | H01L 51/525 257/40 |

FOREIGN PATENT DOCUMENTS

| JP | 2003-257621 | 9/2003 |
|---|---|---|
| JP | 2006-154402 | 6/2006 |
| JP | 2010-212169 | 9/2010 |
| JP | 2013-069581 | 4/2013 |
| JP | 2013-097966 | 5/2013 |
| JP | 2013-149376 | 8/2013 |

OTHER PUBLICATIONS

Ahn J W KR 2007052388 A May 22, 2007.*

* cited by examiner

*Primary Examiner* — Mamadou Diallo
(74) *Attorney, Agent, or Firm* — Renner, Otto, Boisselle & Sklar, LLP

(57) ABSTRACT

An organic EL element according to the present disclosure includes a first electrode having a light-transmission property, a functional layer which is located on the first electrode and which includes a light-emitting layer, and a second electrode which is located on the functional layer, the second electrode having an opening which exposes a part of the functional layer, the second electrode including a scatter reflection surface which scatters and reflects a light emitted from the light-emitting layer, the scatter refection surface opposing to the functional layer.

6 Claims, 9 Drawing Sheets

ORGANIC EL ELEMENT AND LIGHT-EMITTING APPARATUS INCLUDING THE SAME

CROSS REFERENCES TO RELATED APPLICATIONS

This application claims priority to Japanese Patent Application No. 2014-063545, filed on Mar. 26, 2014, the contents of which are hereby incorporated by reference.

BACKGROUND

1. Technical Field

The present disclosure relates to an organic electro luminescence (EL) element utilizing an electroluminescent phenomenon of an organic material and a light-emitting apparatus including the same.

2. Description of the Related Art

Transmission-type organic EL elements have been proposed as a front light illumination apparatus which illuminates a reflection-type liquid crystal display device from the front and an illumination apparatus disposed at a window. For example, Japanese Unexamined Patent Application Publication No. 2013-69581 discloses a configuration in which an organic layer and a transparent electrode layer are disposed on a stripe-shaped reflection electrode having openings.

A technology to reduce brightness variations in the emitted light in such a transmission-type organic EL element has been proposed. Japanese Unexamined Patent Application Publication No. 2010-212169 discloses a configuration in which a reflection layer is disposed in such a way as to overlap an organic layer and this reflection layer is allowed to have a convex shape protruding toward the organic layer. It is mentioned that the reflected light can be scattered and applied to a wide area and brightness variations can be reduced by employing such a configuration as compared with those in the case where the reflection layer is flat. Japanese Unexamined Patent Application Publication No. 2013-149376 discloses a configuration in which a scatter layer is disposed in the portion corresponding to a light-emitting region of a light-emitting surface. It is mentioned that the emitted light is scattered and brightness variations can be reduced by employing such a configuration.

However, as for the transmission-type organic EL element, a technology to reduce brightness variations by a simple configuration has been desired.

SUMMARY

One non-limiting and exemplary embodiment provides a transmission-type organic EL element which can suppress occurrences of brightness variations by a simple configuration.

In one general aspect, the techniques disclosed here feature an organic EL element including a first electrode having a light-transmission property, a functional layer which is located on the first electrode and which includes a light-emitting layer, and a second electrode which is located on the functional layer, the second electrode having an opening which exposes a part of the functional layer, the second electrode including a scatter reflection surface which scatters and reflects a light emitted from the light-emitting layer, the scatter refection surface opposing to the functional layer.

It should be noted that general or specific embodiments may be implemented as an illumination apparatus, a display device, a device, a system, or a method, or any selective combination of an light-emitting element, a light-emitting apparatus, an illumination apparatus, a display device, a device, a system, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Total Configuration

An outline of the configuration of a light-emitting apparatus 1 according to the present embodiment will be described.

Figure 1:
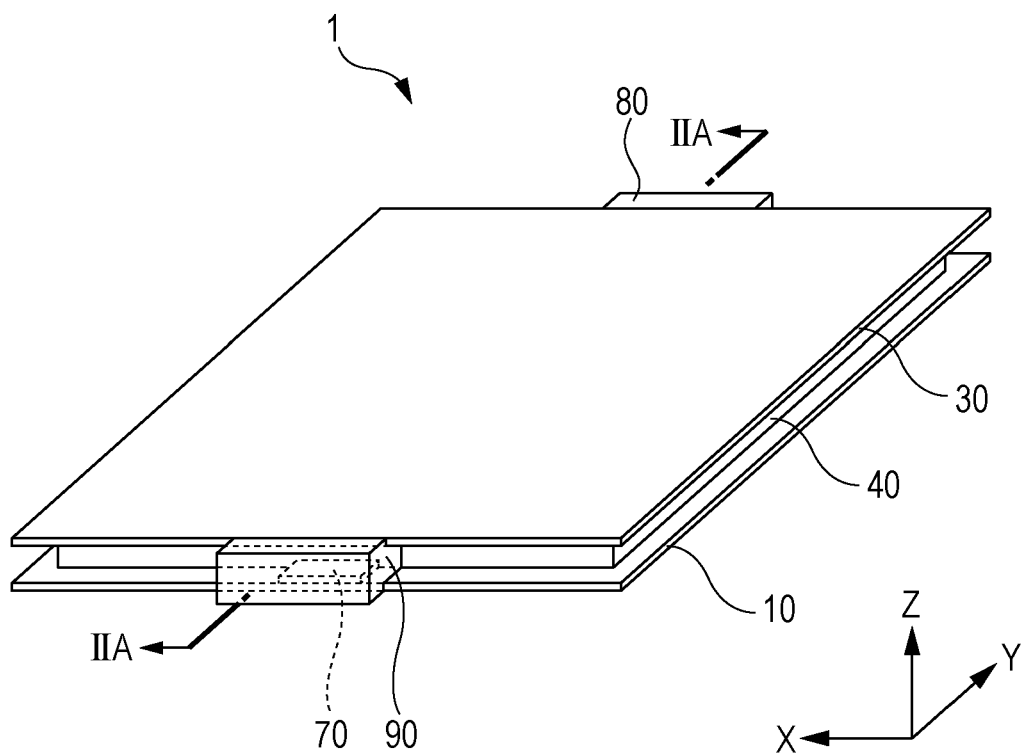
FIG. 1 is a perspective view showing a light-emitting apparatus according to an embodiment of the present disclosure.
Figure 2A:
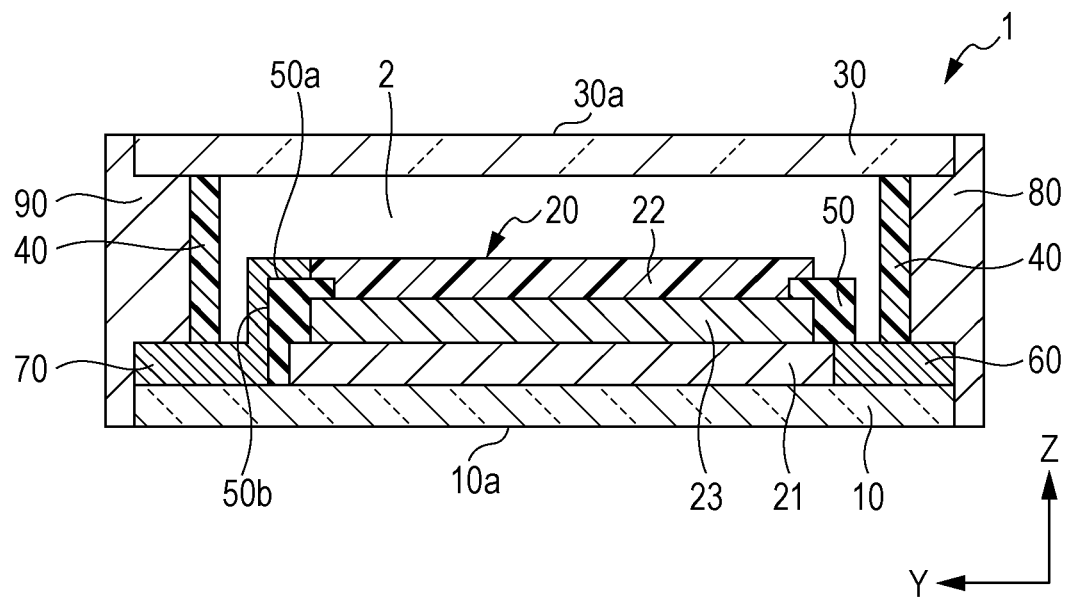
FIG. 2A is a perspective view of a cross-section taken along a line IIA-IIA shown in FIG. 1.

As shown in FIG. 1, the light-emitting apparatus 1 has a substantially rectangular plate-like shape. As shown in FIG. 2A, the light-emitting apparatus 1 includes a first substrate 10, a second substrate 30, and an internal space 2 surrounded by a seal portion 40. A light-emitting element 20 is sealed in the internal space 2. The light-emitting apparatus 1 further includes an insulating layer 50, a first lead wiring 60, a second lead wiring 70, a first conductive portion 80, and a second conductive portion 90.

The first substrate 10 is, for example, a rectangular glass substrate.

The second substrate 30 is, for example, a rectangular glass substrate. The first substrate 10 and the second substrate 30 are opposed to each other with the light-emitting element 20 therebetween.

Figure 3:
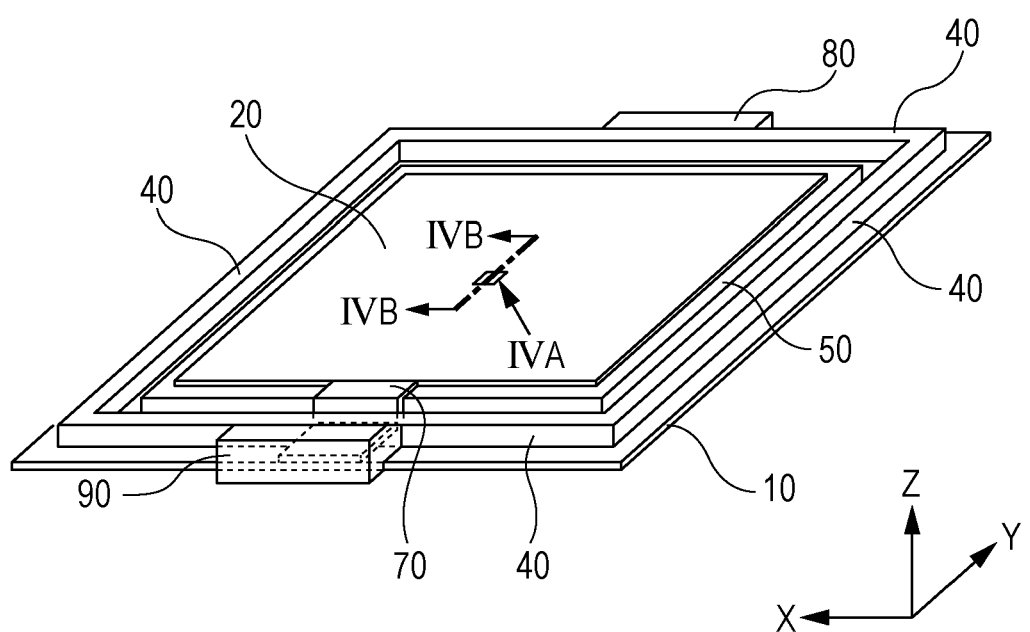
FIG. 3 is a perspective view showing the state in which a second substrate in the light-emitting apparatus shown in FIG. 1 is omitted.

As shown in FIG. 3, the seal portion 40 is disposed around the light-emitting element 20. The light-emitting element 20 is sealed by the first substrate 10, the second substrate 30, and the seal portion 40.

The light-emitting element 20 is a bottom emission type organic electroluminescence (EL) element. As shown in FIG. 2A, the light-emitting element 20 includes a first electrode 21 stacked on the first substrate 10, a second electrode 22 disposed opposing to the first electrode 21, and a functional layer 23 disposed between them. The first electrode 21 is a transparent electrode having a light-transmission property. The second electrode 22 is a reflection electrode having a light-reflection property and has a grid-like shape. That is, the second electrode 22 has openings which penetrate from a plane including a surface on the functional layer 23 side (hereafter referred to as "first surface") to a plane including the surface opposing to the first surface in the thickness direction of the second electrode 22. Therefore, a region provided with the second electrode 22 and regions which are not provided with the second electrode 22 and which are exposed through the openings are present in the surface on the second electrode 22 side of the functional layer 23. The first surface of the second electrode 22 is a surface which scatters and reflects light (hereafter referred to as "scatter reflection surface").

Figure 2B:
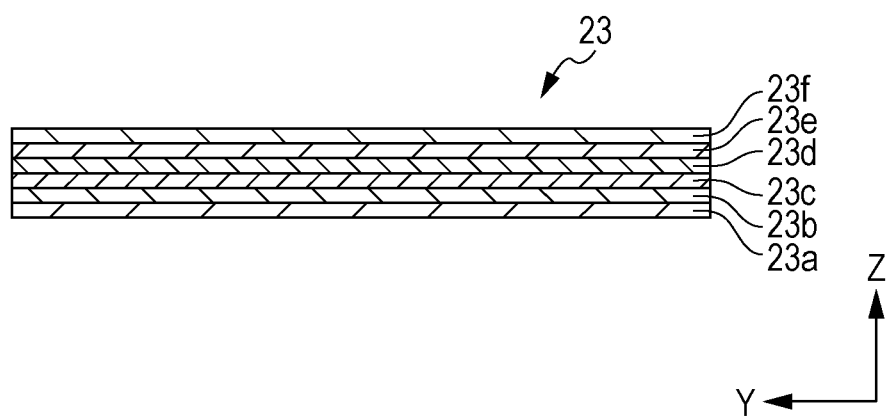
FIG. 2B is a schematic diagram showing an example of the configuration of a functional layer.

As shown in FIG. 2B, the functional layer 23 includes a first carrier injection layer 23a, a first carrier transport layer 23b, a light-emitting layer 23c, an interlayer 23d, a second carrier transport layer 23e, and a second carrier injection layer 23f sequentially from the first electrode 21 side. Here, for example, in the case where the first electrode 21 is specified to be an anode and the second electrode 22 is specified to be a cathode, the first carrier is an electron and the second carrier is a hole.

As shown in FIG. 2A and FIG. 3, the insulating layer 50 electrically insulates the first electrode 21 and the first lead wiring 60 from the second electrode 22 and the second lead wiring 70. The insulating layer 50 is disposed in such a way as to surround the side of the light-emitting element 20.

The first lead wiring 60 is electrically connected to the first electrode 21. As shown in FIG. 2A, the first lead wiring 60 is disposed in a belt-like shape on the upper surface of the first substrate 10 and penetrates the seal portion 40.

The second lead wiring 70 is electrically connected to the second electrode 22. As shown in FIG. 2A, the second lead wiring 70 is disposed in a belt-like shape over the upper surface 50a of the insulating layer 50, the side surface 50b of the insulating layer 50, and the upper surface of the first substrate 10. And the second lead wiring 70 penetrates the seal portion 40.

As shown in FIG. 2A, the first conductive portion 80 is electrically connected to the first lead wiring 60 outside the seal portion 40. The first conductive portion 80 functions as a terminal which feeds a power to the first electrode 21 through the first lead wiring 60.

As shown in FIG. 2A, the second conductive portion 90 is electrically connected to the second lead wiring 70 outside the seal portion 40. The second conductive portion 90 functions as a terminal which feeds a power to the second electrode 22 through the second lead wiring 70.

The individual components of the light-emitting apparatus 1 will be described below in detail.

First Substrate 10

The first substrate 10 may be, for example, a glass substrate. Examples of materials for the glass substrate include soda lime glass and no-alkali glass. The first substrate 10 may be either rigid or flexible. The first substrate 10 is not limited to be rectangular and may be polygonal, circular, and elliptic. The vertical and horizontal dimensions of the first substrate 10 are, for example, several tens of millimeters to several tens of inches and may be selected appropriately in accordance with the size and use of the light-emitting surface desired, the size of production facilities, and the like.

The first substrate 10 is not limited to a glass substrate and may be, for example, a plastic board. In addition, in the case where the first substrate 10 is a plastic board, permeation of water may be suppressed by using a plastic board provided with a protective film, e.g., a SiON film or a SiN film, on the surface. Examples of materials for the plastic board include polyethylene terephthalates, polyethylene naphthalates, polyether sulfones, and polycarbonates.

First Electrode 21

The first electrode 21 has a light-transmission property and functions as a cathode of the light-emitting element 20. The first electrode 21 has a sufficient light-transmission property with respect to the light generated from the light-emitting layer and may be formed from a material having the electrical conductivity. The material for the first electrode 21 may be an electrically conductive light-transmissive material having a small work function. The material for the first electrode 21 may be a material having a work function of 1.9 eV or more and 5 eV or less in such a way that a difference from the lowest unoccupied molecular orbital (LUMO) level does not become excessive. Examples of such electrically conductive light-transmissive materials may include metals, e.g., gold and Al, CuI, indium-tin oxide (ITO), $SnO_2$, ZnO, indium-zinc oxide (IZO), gallium-zinc oxide (GZO), and carbon nanotube. The first electrode 21 may be produced by forming a thin film thereof on the surface of the first substrate 10 through the use of a method, e.g., a vacuum evaporation method, a sputtering method, and a coating method. The light transmittance of the first electrode 21 may be 70% or more.

The film thickness of the first electrode 21 may be, for example, 80 to 200 nm. However, this numerical range is an example and the range is not limited to this numerical range.

Functional Layer 23

Each of the first carrier injection layer 23a, the first carrier transport layer 23b, the light-emitting layer 23c, the interlayer 23d, the second carrier transport layer 23e, and the second carrier injection layer 23f included in the functional layer 23 will be described below.

The light-emitting layer 23c has a function of emitting light containing wavelength components of the visible light. For example, the light emitted from the light-emitting layer 23c is substantially white light. The light-emitting layer 23c may be doped with three types of dopant colorants of red, green, and blue or be produced by stacking a blue hole transporting light-emitting layer, a green electron transporting light-emitting layer, and a red electron transporting light-emitting layer.

The film thickness of the light-emitting layer 23c may be, for example, 60 to 200 nm. However, this numerical range is an example and the range is not limited to this numerical range.

Known light-emitting materials may be used for the light-emitting layer 23c. Example of materials for the light-emitting layer 23c may include polyparaphenylene vinylene derivatives, polythiophene derivatives, polyparaphenylene derivatives, polysilane derivatives, and polyacetylene derivatives. Polyfluorene derivatives, polyvinylcarbazole derivatives, plastids, and high molecular materials of metal complex based light-emitting materials may be employed.

The material for the light-emitting layer 23c is not limited to the above-described compounds derived from fluorescent colorants and may be light-emitting materials, for example, phosphorescent light-emitting materials, e.g., iridium complexes, osmium complexes, platinum complexes, and europium complexes, or compounds or polymers containing them in the molecule. These materials may be selected and used appropriately on an as needed basis. The light-emitting layer 23c may be formed by a wet process, such as, a coating method (for example, a spin coating method, a spray coating method, a die coating method, a gravure coating method, and a screen printing method). However, the film formation method of the light-emitting layer is not limited to the coating method and, for example, a dry process, e.g., a vacuum evaporation method and a transfer method, may be employed.

The first carrier injection layer 23a is an electron injection layer. Examples of materials for the first carrier injection layer 23a may include metal halides, for example, metal fluorides (lithium fluoride, magnesium fluoride or the like) and metal chlorides (sodium chloride, magnesium chloride or the like) Also examples of materials for the first carrier injection layer 23a may include oxides of titanium, zinc, magnesium, calcium, barium, strontium. In the case where these materials are used, the first carrier injection layer 23a may be formed by the vacuum evaporation method. As for the material for the first carrier injection layer 23a, for example, an organic semiconductor material containing a dopant (alkali metal or the like) facilitating electron injection may be used. In the case where such a material is used, the first carrier injection layer 23a may be formed by the coating method.

The film thickness of the first carrier injection layer 23a may be, for example, 10 to 60 nm. However, this numerical range is an example and the range is not limited to this numerical range.

The first carrier transport layer 23b is an electron transport layer. The material for the first carrier transport layer 23b may be selected from the group of compounds having the electron transport property. As for this type of compounds, metal complexes, e.g., Alq3, known as electron transporting materials, compounds having a heterocycle, e.g., phenanthroline derivatives, pyridine derivatives, tetrazine derivatives, and oxadiazole derivatives, and the like may be used, although not limited to them. Any commonly known electron transporting material may also be used.

The film thickness of the first carrier transport layer 23b may be, for example, 5 to 30 nm. However, this numerical range is an example and the range is not limited to this numerical range.

The interlayer 23d has a function of suppressing leakage of the first carrier from the light-emitting layer 23c side to the second electrode 22 side. That is, the interlayer 23d may have a carrier blocking function serving as a first carrier barrier. In addition, the interlayer 23d may have a function of transporting the second carrier to the light-emitting layer 23c, a function of suppressing quenching the excited state of the light-emitting layer 23c. In general, an improvement in the luminous efficacy and an increase in the life of the organic EL element can be facilitated by disposing the interlayer 23d. Examples of materials usable for the interlayer 23d include polyarylamines or derivatives thereof, polyfluorenes or derivatives thereof, polyvinylcarbazoles or derivatives thereof, and triphenyldiamine derivatives. In the case where such materials are used, the interlayer 23d may be formed by a wet process, such as, the coating method (spin coating method, spray coating method, die coating method, gravure coating method, and the like).

The film thickness of the interlayer 23d may be, for example, 5 to 30 nm. However, this numerical range is an example and the range is not limited to this numerical range.

The second carrier transport layer 23e is a hole transport layer. The material for the second carrier transport layer 23e may be a low molecular material or a high molecular material having a small lowest unoccupied molecular orbital (LUMO) level. Examples thereof may include polymers containing an aromatic amine, such as, polyarylene derivatives, e.g., polyvinylcarbazole (PVCz), polypyridine, and polyaniline, which have an aromatic amine in the side chain or main chain, although not limited to them. Meanwhile, examples of materials for the hole transport layer may include 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino) triphenylamine (MTDATA), 4,4'-N,N'-dicarbazolebiphenyl (CBP), Spiro-NPD, spiro-TPD, spiro-TAD, and TNB.

The film thickness of the second carrier transport layer 23e may be, for example, 5 to 30 nm. However, this numerical range is an example and the range is not limited to this numerical range.

The second carrier injection layer 23f is a hole injection layer. The materials for the second carrier injection layer 23f may be organic materials including thiophene, triphenylmethane, hydrazoline, amylamine, hydrazone, stilbene, triphenylamine, and the like. Specific examples thereof may include polyvinylcarbazoles, polyethylene dioxythiophene: polystyrene sulfonate (PEDOT: PSS), and aromatic amine derivatives, e.g., TPD. These materials may be used alone or at least two types of materials may be used in combination. In the case where such materials are used, the second carrier injection layer 23f may be formed by a wet process, such as, the coating method (spin coating method, spray coating method, die coating method, gravure coating method, and the like).

The film thickness of the second carrier injection layer 23f may be, for example, 10 to 60 nm. However, this numerical range is an example and the range is not limited to this numerical range.

In the above explanation, the functional layer 23 includes the first carrier injection layer 23a, the first carrier transport layer 23b, the light-emitting layer 23c, the interlayer 23d, the second carrier transport layer 23e, and the second carrier injection layer 23f. However, it is enough that the functional layer 23 includes at least the light-emitting layer 23c. The functional layer 23 may have either single-layer structure or multilayer structure. The layers other than the light-emitting layer 23c may be disposed on an as needed basis.

Second Electrode 22

Figure 4A:
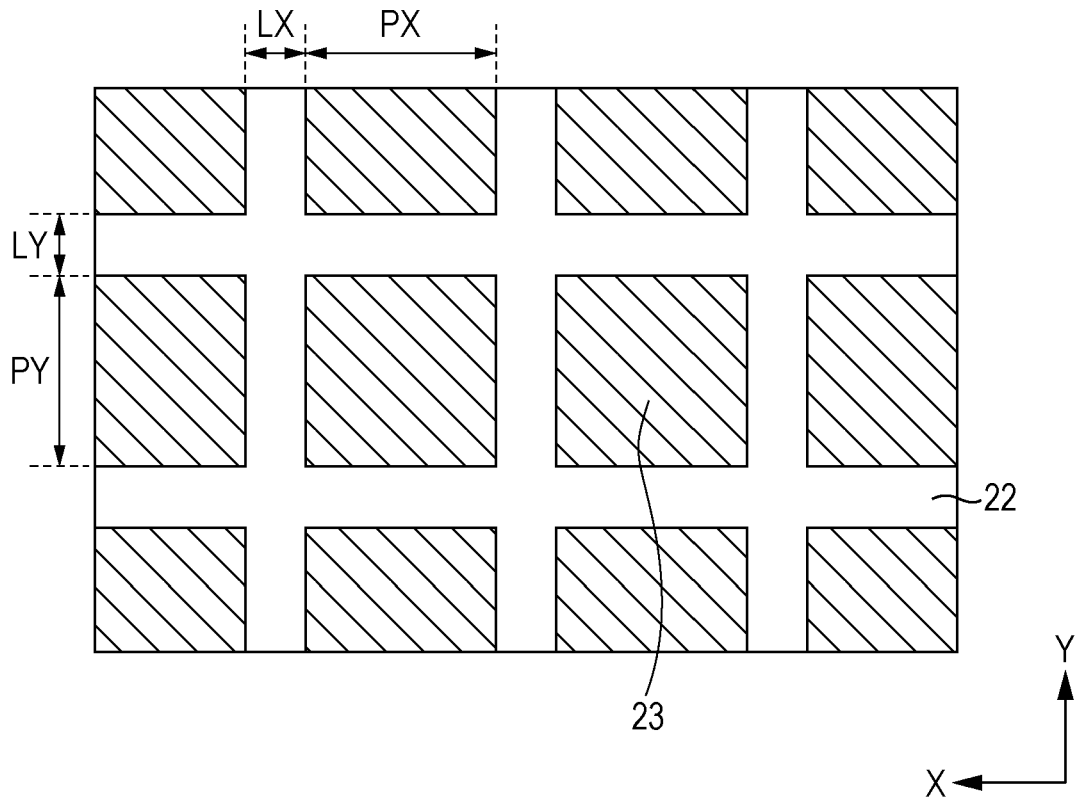
FIG. 4A is a magnified top view of a portion indicated by IVA shown in FIG. 3.

The second electrode 22 has a grid-like shape and is disposed on the functional layer 23. FIG. 4A is a magnified diagram of part of the light-emitting element 20, when viewed from above. On the functional layer 23, a region provided with the second electrode 22 and regions which are provided with no second electrode 22 and at which the functional layer 23 is exposed are present.

Figure 4B:
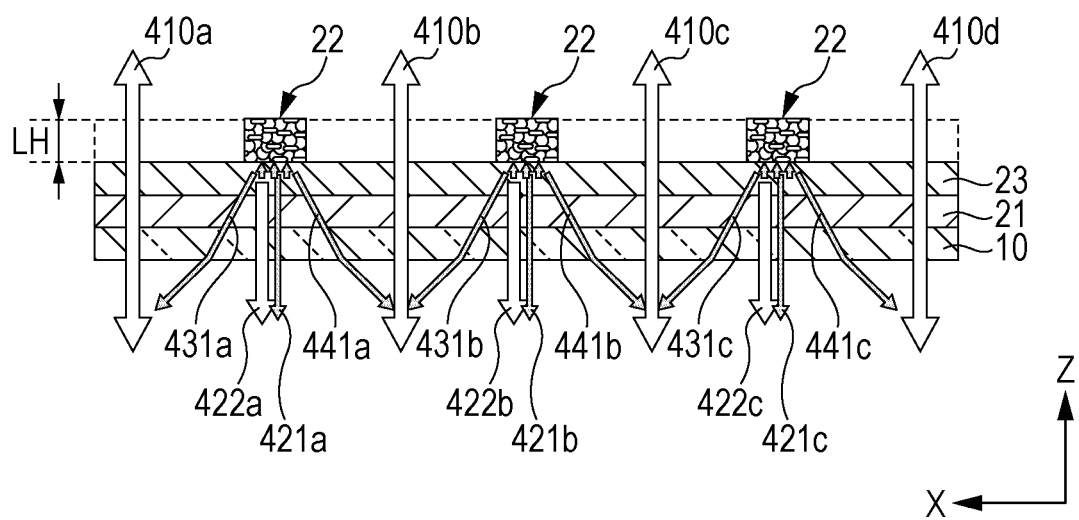
FIG. 4B is a schematic diagram showing a cross-section taken along a line IVB-IVB of the portion indicated by IVA.

In FIG. 4A, the widths LX and LY of the second electrode 22 are, for example, 1 μm to 100 μm. The opening widths PX and PY of the second electrode 22 are, for example, 100 μm to 2,500 μm. In FIG. 4B, the height LH of the second electrode 22 is, for example, 50 μm to 100 μm. However, LX, LY, PX, PY, and LH are not limited to the above-described numerical ranges and may be set appropriately on the basis of the size and the like of the light-emitting element 20.

The second electrode 22 contains conductive particles and an organic binder. The conductive particle may be, for example, silver. Silver is stable in the air and has high electrical conductivity. The conductive particles scatter and reflect a light emitted from the light-emitting layer 23c.

The conductive particles constituting the second electrode 22 include spherical particles having a spherical shape and flake-shaped particles having the shape of a flake. In the present specification, the spherical particle refers to a particle having a ratio of the maximum diameter of the particle to the minimum diameter of the particle of 1 or more and 1.1 or less. The flake-shaped particle refers to a particle having a ratio of the maximum particle diameter to the minimum diameter of the particle diameter of more than 1.1.

The spherical particles are easy to come in contact with each other at a point. Therefore, in the case where merely spherical particles are used as the conductive particles, it is difficult to reduce the resistance of the electrode. Consequently, in order to obtain sufficient electrical conductivity, it is desired that spherical particles be filled at a high density. However, the spherical particles scatter and reflect light easily as compared with the flake-shaped particles because of the shape thereof. On the other hand, the flake-shaped particles are easy to come in contact with each other at a plane. Therefore, in the case where merely flake-shaped particles are used as the conductive particles, the resistance of the electrode is reduced relatively easily. Consequently, the flake-shaped conductive particles are typically used for the electrode and the wiring.

However, the second electrode 22 includes both spherical particles and flake-shaped particles where the primary component is the spherical particles. That is, the weight ratio of the spherical particles relative to the total amount of the spherical particles and the flake-shaped particles is larger than 50 W %. As described above, in the case where the flake-shaped particles are used, the electrical conductivity of the electrode is improved and the content of the conductive particles can be reduced. However, in the present embodiment, the primary component of the electrically conductive particles used for the second electrode 22 is the spherical particles. Therefore, a high proportion of spherical particles are present on the surface of the second electrode 22 as compared with the flake-shaped particles. Consequently, the second electrode 22 scatters and reflects light easily.

The each arithmetic mean diameter of both the spherical particles and the flake-shaped particles may be 0.1 μm or more and 10 μm or less. Here, the diameter of a particle is calculated by a formula of (minimum diameter+maximum diameter)/2. The arithmetic mean diameter can be measured on the basis of image processing of a micrograph.

The diameters of the conductive particles are not necessarily the same. The material for the conductive particle is not limited to silver, and may be gold, copper, or the like.

The second electrode 22 may be formed by, for example, printing a paste, in which an organic binder and an organic solvent are mixed with conductive particles, by a screen printing method, gravure printing method, or the like. Examples of organic binders include acrylic resins, polyethylenes, polypropylenes, polyethylene terephthalates, polymethyl methacrylates, polystyrenes, polyether sulfones, polyallylates, polycarbonate resins, polyurethanes, polyacrylonitriles, polyvinyl acetals, polyamides, polyimides, diacrylphthalate resins, cellulose based resins, polyvinyl chlorides, polyvinylidene chlorides, polyvinyl acetates, other thermoplastic resins, and copolymers of at least two types of monomers constituting these resins. However, the organic binder is not limited to them.

Other Configurations

The material for the first lead wiring 60 may be the same as the material for the first electrode 21. In this case, the first lead wiring 60 and the first electrode 21 may be formed at the same time.

The material for the second lead wiring 70 may be the same as the material for the second electrode 22. In this case, the second lead wiring 70 and the second electrode 22 may be formed at the same time.

The material for the first conductive portion 80 and the second conductive portion 90 may be a material having the electrical conductivity. For example, a metal may be employed.

The positions at which the first lead wiring 60 and the second lead wiring 70 penetrate the seal portion 40 are arbitrary positions.

The second substrate 30 is a substrate covering the light-emitting element 20. The same material as the material for the above-described first substrate 10 may be used. The material for the second substrate 30 may be the same as the material for the first substrate 10 or be a different material.

The second substrate 30 may have, for example, a shape with a concave portion which can store the light-emitting element 20. Such a second substrate 30 can seal the light-emitting element 20 by directly bonding the periphery of the second substrate 30 to the first substrate 10. Therefore, there is no need to dispose the seal portion 40 as a separate member. In the case where the seal portion 40 is disposed as in the present embodiment, the materials for the second substrate 30 and the seal portion 40 may be selected individually in accordance with the respective characteristics desired. Here, examples of characteristics concerned with the second substrate 30 include optical properties (light transmittance, refractive index, and the like). Examples of characteristics concerned with the seal portion 40 include a gas barrier property.

The seal portion 40 is a member which seals the light-emitting element 20. The seal portion 40 is located between the peripheral portion of the first substrate 10 and the peripheral portion of the second substrate 30. The entire periphery of the seal portion 40 is hermetically bonded to the first substrate 10 and the second substrate 30.

The material for the seal portion 40 may be, for example, a polyimide, a novolak resin, or an epoxy resin. The bonding material which bonds the seal portion 40 to the first substrate 10 may be, for example, an epoxy resin or an acrylic resin. The epoxy resin and the acrylic resin may be of an ultraviolet curable type or a thermosetting type. The bonding material may be a material in which an epoxy resin is allowed to contain a filler (for example, silica or alumina).

The bonding material which bonds the seal portion 40 to the second substrate 30 may be, for example, an epoxy resin, an acrylic resin, or frit glass. The epoxy resin and the acrylic resin may be of an ultraviolet curable type or a thermosetting type. The bonding material may be a material in which an epoxy resin is allowed to contain a filler (for example, silica or alumina).

The material for the insulating layer 50 may be, for example, a polyimide, a novolak resin, or an epoxy resin. In the case where these materials are used, the insulating layer 50 may be formed by, for example, the screen printing method, a gravure printing method, or the like. The insulating layer 50 may be produced by, for example, allowing a photo-curable resin, e.g., an epoxy resin, an acrylic resin, or a silicone resin, to contain a moisture absorbent. The moisture absorbent may be an oxide or a sulfate of an alkaline earth metal.

The internal space 2 (refer to FIG. 2A) may be filled with a light-transmissive resin. The shape of the light-emitting apparatus 1 may be a shape other than a rectangular shape and may be, for example, a polygonal shape, a circular shape, or an elliptic shape. The light-emitting element 20 may be of a top emission type in which the second electrode 22, the organic layer 23, and the first substrate 21 are stacked sequentially on a substrate 10. The shape of the opening of the second electrode may be another shape, e.g., an equilateral triangular shape or a regular hexagonal shape. The shape of the second electrode 22 is not limited to the grid-like shape and may be, for example, a comb-like shape.

Basic Operation

Figure 5:
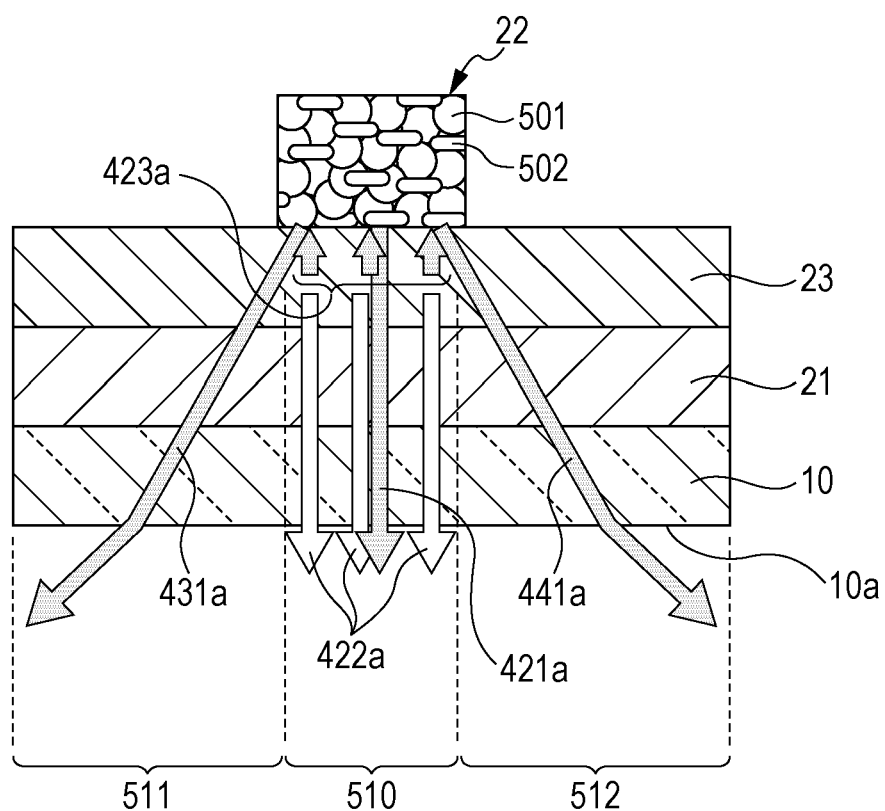
FIG. 5 is a magnified schematic diagram of a cross-section showing part of FIG. 4B.

The light-emitting operation of the light-emitting apparatus 1 will be described below with reference to FIG. 4B and FIG. 5. In the explanation hereafter, in a plan view, the region in which the second electrode 22 is present is referred to as a "voltage application region". The region corresponding to the opening of the second electrode 22 is referred to as a "non-voltage application region". In the light-emitting apparatus 1, the surface on the emission side of the emitted light, specifically the lower surface 10a of the first substrate 10 in FIG. 2A, is referred to as a "light-emitting surface". The surface on the opposite side of the "light-emitting surface", specifically the upper surface 30a of the second substrate, is referred to as a "non-light-emitting surface".

In FIG. 4B, when a voltage is applied between the first electrode 21 and the second electrode 22, in the voltage application region, electrons are injected from the first electrode 21 to the functional layer 23 and holes are injected from the second electrode 22 to the functional layer 23. Then, the injected holes and electrons are re-bonded in the light-emitting layer 23c and light is emitted. On the other hand, in the non-voltage application region, a voltage is not applied to the functional layer 23 and, therefore, light is not emitted.

Among the light emitted from the light-emitting layer 23c, the light (422a, 422b, 422c) directly heading for the first substrate 10 passes through the first substrate 10 and is emitted to the outside. On the other hand, the light (423a) heading for the second electrode 22 reaches the first surface of the second electrode 22 and is reflected at the first surface. The scattered and reflected light moves toward the first substrate 10, passes through the first substrate 10, and is emitted to the outside. In this way, the light emitted from the light-emitting layer is emitted substantially from a first electrode side. For example, a light emitted from the first electrode side may be more than 90% of an entire light emitted outside.

Therefore, the light, which directly heads for the first electrode 21 side from the light-emitting layer 23c, and the light, which heads for the second electrode 22 side from the light-emitting layer 23c, which is scattered and reflected at the second electrode 22, and which heads for the first electrode 21 side, are emitted from the portion corresponding to the voltage application region in the light-emitting surface 10a. Meanwhile, the light, which heads for the second electrode 22 side from the light-emitting layer 23c and which is scattered and reflected at the second electrode 22 is emitted from the portion corresponding to the non-voltage application region in the light-emitting surface 10a.

In this manner, the light which is emitted from the portion corresponding to the voltage application region in the light-emitting surface is reduced because of scattering and reflection at the first surface of the second electrode 22. On the other hand, the light emitted from the portion corresponding to the non-voltage application region in the light-emitting surface increases because of scattering and reflection at the first surface of the second electrode 22. Consequently, in the light-emitting surface, a difference in the brightness between the portion corresponding to the voltage application region and the portion corresponding to the non-voltage application region is reduced and the brightness variations are suppressed.

As shown in FIG. 4B, the light (410a to 410d) incident from the outside can pass through the light-emitting apparatus 1 because of the opening portions in the second electrode 22. That is, the light-emitting apparatus 1 has a light-transmission property and functions as a transmission-type single-sided light-emitting panel.

Illumination Apparatus

An illumination apparatus 601 incorporated with the light-emitting apparatus 1 will be described with reference to FIGS. 6A and 6B.

The illumination apparatus 601 includes the light-emitting apparatus 1, a drive circuit (not shown in the drawing) which supplies an electric power to the light-emitting apparatus 1, and a power supply switch (not shown in the drawing). When the power supply switch is turned on, the drive circuit supplies an electric power to the light-emitting apparatus 1. Specifically, a voltage is applied between the first conductive portion 80 and the second conductive portion 90, and the illumination apparatus 601 is brought into a light-emitting state.

Figure 6B:
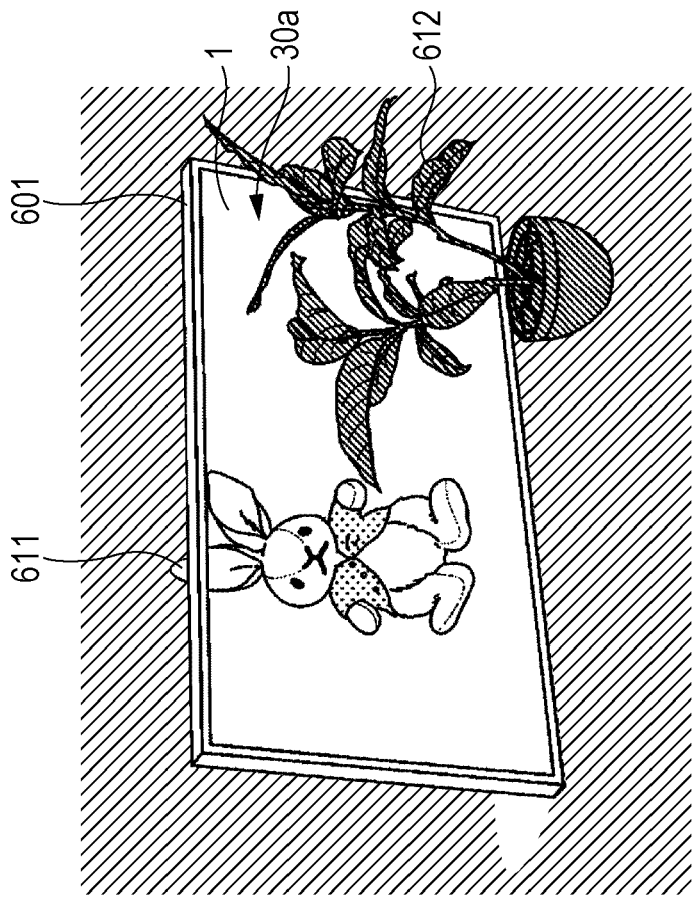
FIG. 6B is a schematic diagram showing an example of the case where illumination equipment incorporated with a light-emitting apparatus is viewed from a non-light-emitting surface side.
Figure 6A:
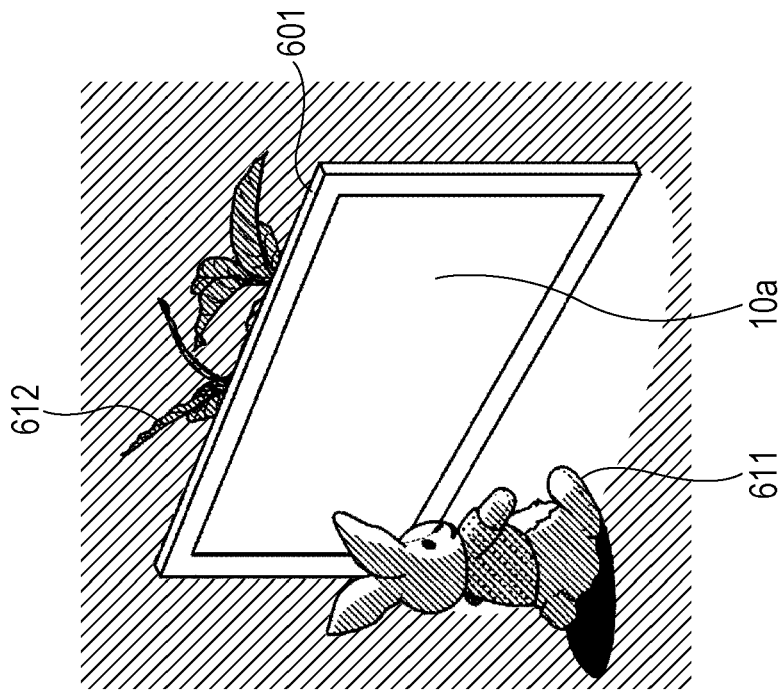
FIG. 6A is a schematic diagram showing an example of the case where illumination equipment incorporated with a light-emitting apparatus is viewed from a light-emitting surface side.

FIGS. 6A and 6B shows the case where the illumination apparatus 601 is in the light-emitting state.

As shown in FIG. 6A, light is emitted from the light-emitting surface 10a of the light-emitting apparatus 1, and the light illuminates a subject 611 placed on the light-emitting surface 10a side. On the other hand, light is hardly emitted from the non-light-emitting surface 30a. Consequently, an observer on the non-light-emitting surface 30a side is not dazzled even in the light-emitting state. Therefore, as shown in FIG. 6B, the subject 611 on the light-emitting surface 10a side can be viewed from the non-light-emitting surface 30a side.

When the power supply switch is turned off, the drive circuit stops supplying the electric power, and the light-emitting apparatus 1 is brought into a non-light-emitting state. At this time, most of the light incident on the light-emitting apparatus 1 from the light-emitting surface 10a side passes through the openings of the second electrode 22. However, part of the light is reflected at the second electrode 22. If the first surface of the second electrode 22 is a flat reflection surface, the image of a subject (for example, the face of a user) located on the light-emitting surface 10a side becomes a reflected image by being reflected at the first surface of the second electrode 22. On the other hand, in the light-emitting apparatus 1, the first surface of the second electrode 22 is a scatter reflection surface which scatters and reflects the light and, therefore, such a reflection image can be suppressed.

The light-emitting apparatus 1 may be applied to, for example, a transparent box type water tank. For example, the light-emitting apparatus 1 is disposed on the front surface of the water tank. The light-emitting apparatus 1 emits light toward the inside of the water tank and lights up fishes and the like in the water tank. On the other hand, the light is not emitted to the outside of the water tank and, therefore, the fishes and the like which are lit up can be appreciated from the outside of the water tank.

Manufacturing Method

Next, a method for manufacturing the light-emitting element 20 will be described with reference to FIGS. 7A to 7D and FIGS. 8A to 8C.

Figure 7A:
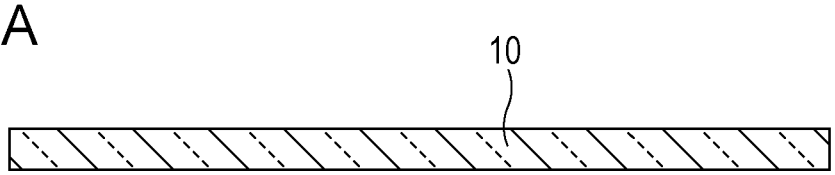
FIGS. 7A to 7D are schematic diagrams showing the individual steps of a method for manufacturing a light-emitting element used for a light-emitting apparatus according to an embodiment.
Figure 7B:
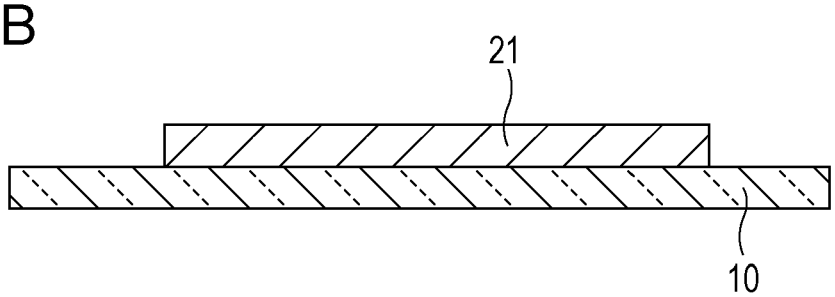
Figure 7C:
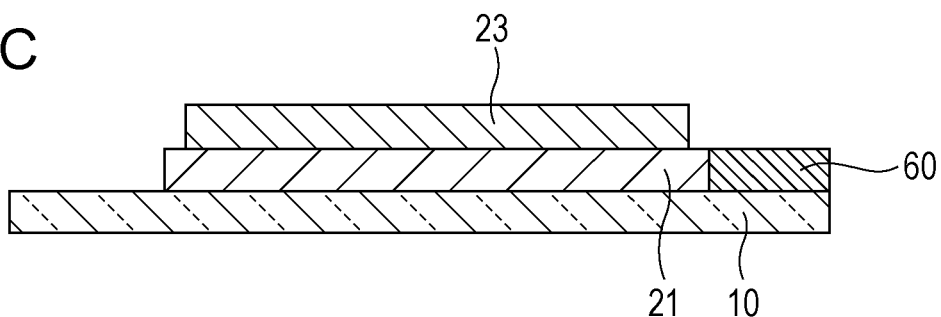
Figure 7D:
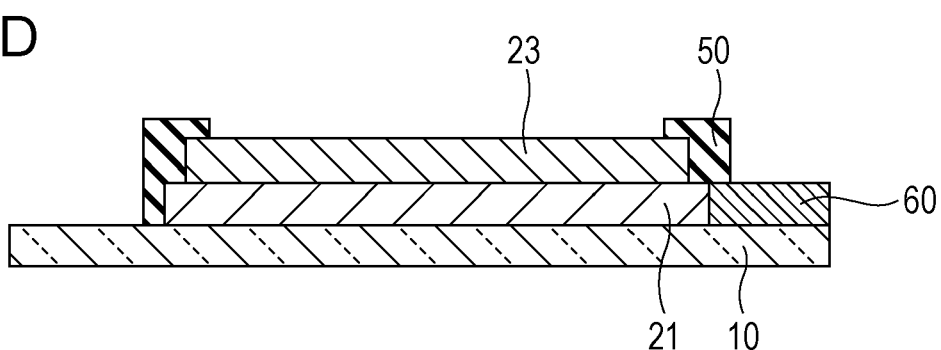

The first electrode 21 is formed on one surface of the first substrate 10 by using a thin film deposition process, e.g., a vacuum evaporation method, or a wet process, e.g., a coating method (FIGS. 7A and 7B). The functional layer 23 is formed on the first electrode 21 by using, for example, the coating method. The first lead wiring 60 electrically connected to the first electrode 21 is further formed on the substrate 10 (FIG. 7C). The insulating layer 50 is formed around the first electrode 21 and the functional layer 23 by using, for example, the screen printing method, the gravure printing method, or the like (FIG. 7D).

Figure 8A:
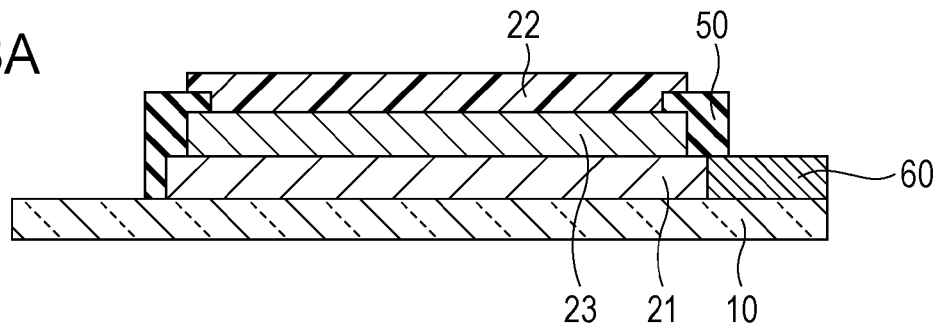
FIGS. 8A to 8C are schematic diagrams showing the individual steps of a method for manufacturing a light-emitting element used for a light-emitting apparatus according to an embodiment.
Figure 8B:
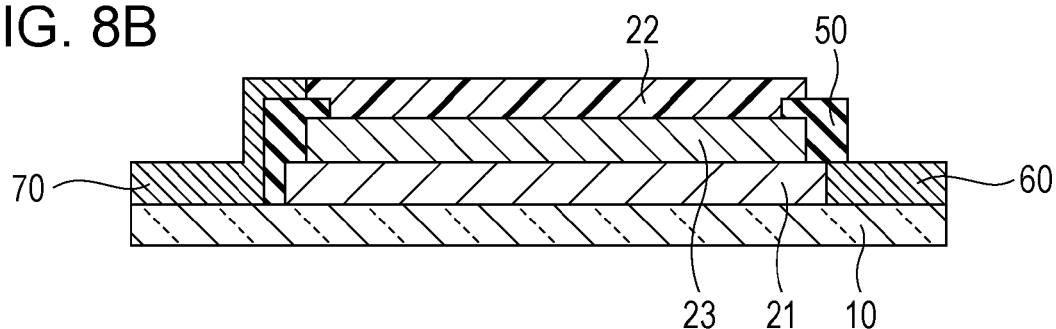
Figure 8C:
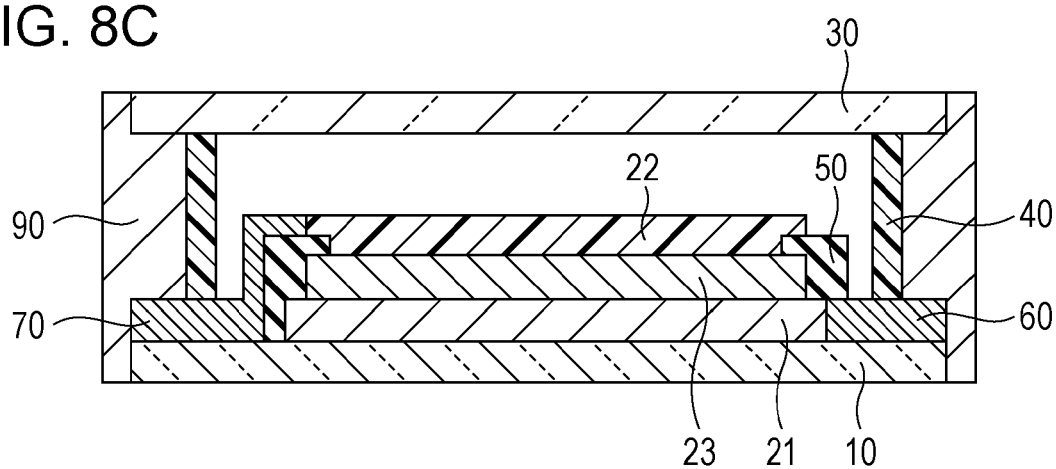

The grid-shaped second electrode 22 is formed on the functional layer 23 by using, for example, the coating method (FIG. 8A). The second lead wiring 70 is formed from the upper surface of the insulating layer 50 to the upper surface of the first substrate 10 by using, for example, the coating method (FIG. 8B). The frame-shaped seal portion 40 is formed on the peripheral portion of the first substrate 10. The seal portion is bonded to the upper surface of the first substrate 10 by using a bonding material made from an epoxy resin or the like. The second substrate 30 is further bonded to the seal portion 40 by using a bonding material made from an epoxy resin or the like. The first conductive portion 80 electrically connected to the first lead wiring 60 is formed. Also, the second conductive portion 90 electrically connected to the second lead wiring 70 is formed (FIG. 8C).

According to the above-described steps, the light-emitting element 20 is produced.

MODIFIED EXAMPLE

The above-described light-emitting element and illumination apparatus may be modified as described below.

Figure 9A:
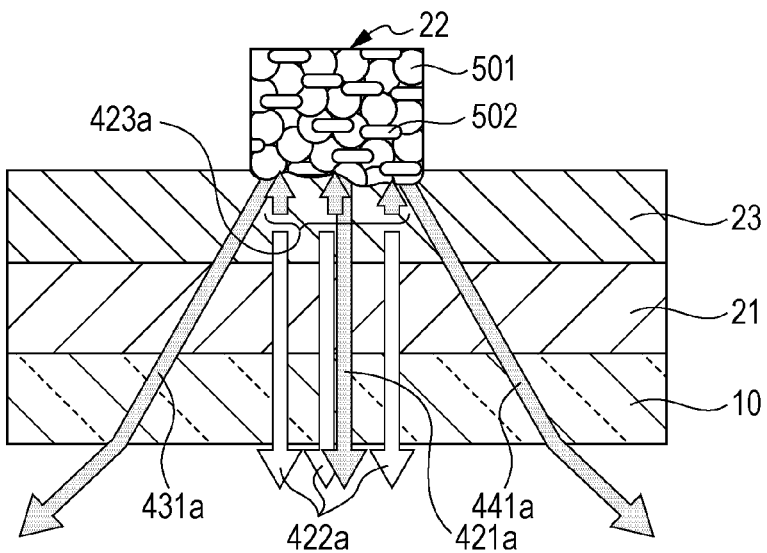
FIG. 9A is a schematic diagram of a cross-section showing part of a light-emitting element according to a modified example.

(a) As shown in FIG. 9A, the interface between the second electrode 22 and the functional layer 23 may be allowed to have an uneven shape. In the case where the interface is allowed to have the uneven shape, the light is scattered at a wider angle when the light is scattered and reflected at the first surface of the second electrode 22. Consequently, brightness variations on the light-emitting surface 10a can be further reduced. Examples of methods for allowing the interface to have the uneven shape include a method in which an organic solvent having high solubility in organic compounds and high molecular compounds is contained into an ink for forming the second electrode 22. As for the organic solvent, for example, tetrahydrofuran (THF) may be used. In the case where such an organic solvent is used, the organic solvent erodes the functional layer 23 when the second electrode 22 is formed. According to this, the interface between the second electrode 22 and the functional layer 23 is allowed to have an uneven shape.

As for another method for allowing the interface to have an uneven shape, before the second electrode 22 is formed, the surface of the functional layer 23 may be allowed to have an uneven shape. Specifically, for example, in the case where the uppermost layer of the functional layer 23 is formed by using the coating method, the drying time (prebake time) thereof may be reduced. For example, the surface of the uppermost layer of the organic layer 23 is allowed to have an uneven shape by reducing the drying time to half. The second electrode 22 is formed on the functional layer 23 with the surface having the uneven shape and, thereby, the interface between the second electrode 22 and the functional layer 23 is allowed to have an uneven shape.

Figure 9B:
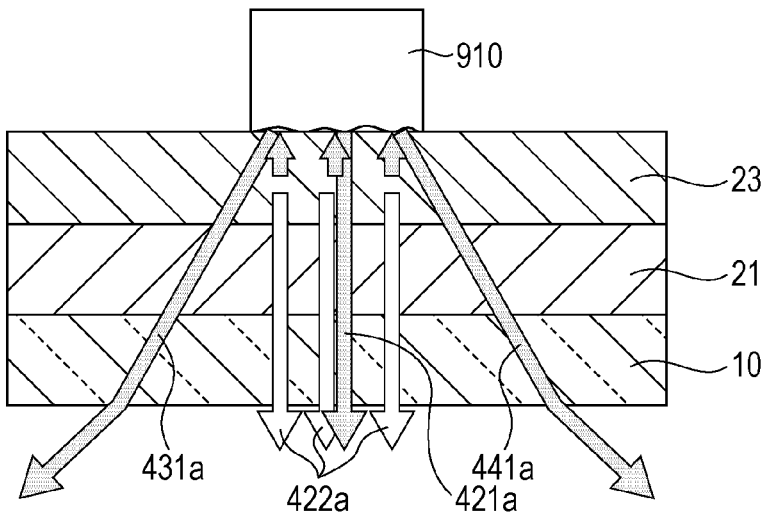
FIG. 9B is a schematic diagram of a cross-section showing part of a light-emitting element according to a modified example.

(b) As shown in FIG. 9B, a metal electrode 910 the surface of which on the functional layer 23 side is worked into an uneven shape may be used as the second electrode 22. The surface, which has been worked into the uneven shape, of the metal electrode 910 functions as the scatter reflection surface.

The metal electrode 910 may be formed as described below, for example. A metal film is formed on an insulating transparent sheet. A surface treatment is performed in such a way that the surface of the metal film is made into an uneven shape. The metal film with the surface having the uneven shape is patterned into a grid-like shape by using a dry etching method or a wet etching method. The patterned metal film on the transparent sheet is transferred to the functional layer 23. In this manner, the metal electrode 910 can be formed on the functional layer 23. The light is scattered and reflected at the first surface of the second electrode 22 because of such a configuration and, thereby, brightness variations can be reduced.

Figure 9C:
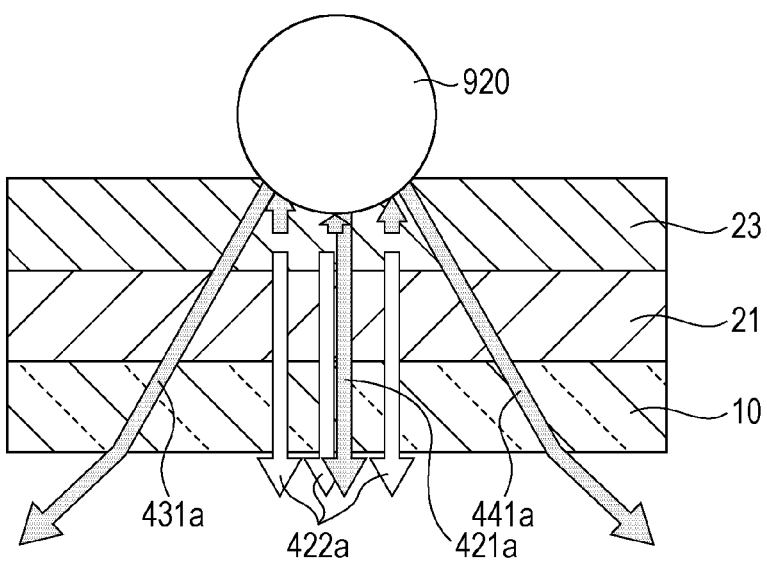
FIG. 9C is a schematic diagram of a cross-section showing part of a light-emitting element according to a modified example.

(c) As shown in FIG. 9C, a metal thin wire 920 having a circular or elliptic cross-section may be used as the second electrode. The surface on the functional layer 23 side of this metal thin wire 920 functions as a scatter reflection surface.

The metal thin wire 920 is formed as described below, for example. A plurality of metal thin wires 920 are fixed on the insulating transparent sheet in such a way as to have a grid-like shape. The metal thin wires 920 on the transparent sheet are transferred to the functional layer 23. At this time, fixing may be performed by applying a pressure in such a way that the metal thin wires 920 are stuck into the functional layer 23. In this manner, the metal thin wires 920 can be formed on the functional layer 23. The light is scattered and reflected at the curved surface of the second electrode 22 because of such a configuration and, thereby, brightness variations can be reduced.

In this regard, the above-described embodiments and the individual modified examples may be combined partly.

Supplementation

The above-described embodiments show specific examples according to the present disclosure. Numerical values, shapes, materials, constituents, layout locations and connection forms of the constituents, steps, orders of steps, and the like are no more than examples and are not intended to limit the present disclosure. Among the constituents in the embodiments, steps which are not described in independent claims showing the most generic concepts of the present disclosure are explained as optional constituents constituting preferred forms.

For the sake of understanding of the present disclosure, the scales of the constituents of the individual drawings mentioned in the above-described individual embodiments may be different from the scales based on actual sizes. The present disclosure is not limited to the above-described individual embodiments and modifications can be made appropriately within the bounds of not departing from the gist of the present disclosure.

In the light-emitting element and the illumination apparatus, members, e.g., circuit components and lead wires, are also present on the substrate. However, explanations thereof are not provided because the electric wiring and the electric circuit can be executed in various aspects on the basis of common knowledge in the related technical fields and there is no direct relationship with the explanations of the present disclosure. The above-described individual drawings are schematic diagrams and are not precise in a strict sense.

The light-emitting element and the illumination apparatus including the same according to the present disclosure are transmission-type one-sided light-emitting panels and may be applied to illumination apparatuses used indoors and outdoors, show windows, transparent panels of water tanks, digital signage used in public facilities, advertising towers, and the like.

What is claimed is:

1. An organic EL element comprising:
    a first electrode having a light-transmission property;
    a functional layer which is located on the first electrode and which includes a light-emitting layer; and
    a second electrode which is located on the functional layer, the second electrode having an opening which exposes a part of the functional layer, the second electrode including a scatter reflection surface which scatters and reflects a light emitted from the light-emitting layer, the scatter refection surface opposing to the functional layer,
    wherein the second electrode contains a plurality of particles which compose the scatter reflection surface, and
    the plurality of particles contain spherical particles and flake-shaped particles, the spherical particles being contained more than the flake-shaped particles in terms of mass ratio.

2. The organic EL element according to claim 1, wherein an arithmetic mean particle diameter of the plurality of particles is 0.1 µm or more and 10 µm or less.

3. The organic EL element according to claim 1, wherein an interface between the second electrode and the functional layer has an uneven shape.

4. The organic EL element according to claim 1, wherein an interface between the second electrode and the functional layer has a convex shape protruding toward the functional layer side.

5. The organic EL element according to claim 1,
    wherein the second electrode is configured such that a light incident from outside transmits through the openings in the second electrode and such that the light emitted from the light-emitting layer is emitted substantially from a first electrode side.

6. A light-emitting apparatus comprising:
    the organic EL element according to claim 1, and
    a drive circuit which supplies an electric power to the organic EL element.

* * * * *